(12) United States Patent
Yang et al.

(10) Patent No.: US 11,087,826 B2
(45) Date of Patent: Aug. 10, 2021

(54) STORING METHOD AND APPARATUS OF DATA

(71) Applicant: Samsung Electronics Co., Ltd., Suwon-si (KR)

(72) Inventors: Pan Yang, Xi'an (CN); Dong-gun Kim, Hwaseong-si (KR); Wei Xia, Xi'an (CN)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 10 days.

(21) Appl. No.: 16/544,241

(22) Filed: Aug. 19, 2019

(65) Prior Publication Data

US 2020/0152253 A1 May 14, 2020

(30) Foreign Application Priority Data

Nov. 14, 2018 (CN) .......................... 201811354988.6

(51) Int. Cl.
| | | |
|---|---|---|
| *G11C 7/00* | (2006.01) | |
| *G11C 7/22* | (2006.01) | |
| *G11C 11/409* | (2006.01) | |
| *G06F 3/06* | (2006.01) | |

(52) U.S. Cl.
CPC ............ *G11C 11/409* (2013.01); *G06F 3/064* (2013.01); *G06F 3/0611* (2013.01); *G06F 3/0619* (2013.01); *G06F 3/0659* (2013.01); *G06F 3/0683* (2013.01)

(58) Field of Classification Search
CPC .... G11C 11/409; G06F 3/0611; G06F 3/0619; G06F 3/064; G06F 3/0659; G06F 3/0683
See application file for complete search history.

(56) References Cited

U.S. PATENT DOCUMENTS

| | | | |
|---|---|---|---|
| 9,348,521 B2 | 5/2016 | Yoon et al. | |
| 9,575,664 B2 | 2/2017 | Chen et al. | |
| 9,582,210 B2 | 2/2017 | Taylor | |
| 9,686,352 B2 | 6/2017 | Gulati et al. | |
| 9,830,107 B2 | 11/2017 | Blount | |
| 2002/0129048 A1 | 9/2002 | Qiu et al. | |
| 2016/0117105 A1* | 4/2016 | Thangaraj | G06F 3/0625 711/103 |
| 2017/0192687 A1 | 7/2017 | Huo et al. | |
| 2017/0242729 A1 | 8/2017 | Chen et al. | |
| 2018/0067961 A1 | 3/2018 | Yang et al. | |
| 2018/0081543 A1 | 3/2018 | Muchherla et al. | |
| 2018/0081594 A1 | 3/2018 | Jung et al. | |
| 2019/0332282 A1* | 10/2019 | Urakami | G06F 3/0605 |
| 2020/0125258 A1* | 4/2020 | Chiba | G06F 11/3034 |

* cited by examiner

*Primary Examiner* — Toan K Le
(74) *Attorney, Agent, or Firm* — Harness, Dickey & Pierce, P.L.C.

(57) ABSTRACT

Provided is a method including acquiring reading and writing information of logical chunks of a storage apparatus in a number of historical periods before a current time, and predicting reading and writing information of the logical chunks in a next period according to reading and writing information of the logical chunks in a number of historical periods before the current time and a data prediction model. The data prediction model indicates a relationship between reading and writing information of the logical chunks in a next period and reading and writing information of the logical chunks in a number of historical periods before the current time.

20 Claims, 1 Drawing Sheet

STORING METHOD AND APPARATUS OF DATA

CROSS-REFERENCE TO RELATED APPLICATIONS

This application claims the benefit of Chinese Patent Application No. 201811354988.6, filed on Nov. 14, 2018, in the Chinese Intellectual Property Office, the disclosure of which is incorporated herein in its entirety by reference.

BACKGROUND

Inventive concepts relate to a data storage field, and more particularly, relates to a data storing method and/or apparatus of data.

Storage technology for SSD (Solid State Drives) mainly includes two types: Storage Tiering technology and Multi-Stream storage technology.

Storage Tiering technology provides a solution for HDD (Hard Disk Drive) and SSD mixed use. The mixed use may achieve storage of data in different performance storage media according to simple cold and hot classification on reading and writing data. Storage Tiering technology with respect to the classification of cold and hot data is relatively simple, and/or is a static general method.

Multi-stream storage technology controls the location into which data is written inside of the SSD such that a stream ID is specified for data request. Multi-stream storage technology assigns stream addresses at the file level, and either directly assigns stream addresses for files by modifying application source code, or assigns stream addresses for different files by customizing policies. Assignment policies are manually customized according to load characteristics, and are not able to be adaptive.

Therefore, storage cost of the existing storage technology for SSD is relatively high and affects the usage lifetime of the SSD.

SUMMARY

At least one advantage of a storing method and apparatus of data according to example embodiments is reducing the storage cost of existing SSD storage technology is relatively high and/or improving the usage lifetime of the SSD.

According to some example embodiments of inventive concepts, there is provided a storing method of data, which includes acquiring reading and writing data information of respective logical chunks of a storage apparatus in a particular number of historical periods before a current time, predicting reading and writing data information of the respective logical chunks in a next period, the predicting the reading and writing being according to a) reading and writing data information of the respective logical chunks in the particular number of historical periods before the current time and b) a data prediction model. The data prediction model indicates, a corresponding relationship between reading and writing data information of the respective logical chunks in a next period, and reading and writing data information of the respective logical chunks in the particular number of historical periods before the current time. The method further includes determining physical storage areas of the respective logical chunks in the next period, according to the predicted reading and writing data information of the respective logical chunks in the next period, and in the next period, in response to receiving a writing request, writing the data corresponding to the writing request into the physical storage area of the logical chunk corresponding to the writing request.

According to some example embodiments of inventive concepts, there is provided a storing apparatus of data, including a processor, wherein the processor is configured to execute non-transitory machine readable instructions that, when executed by the processor, cause the process to, acquire reading and writing data information of respective logical chunks of a storage apparatus in a particular number of historical periods before a current time, predict reading and writing data information of the respective logical chunks in a next period, the prediction being according to, reading and writing data information of the respective logical chunks in the particular number of historical periods before the current time, and a data prediction model, wherein the data prediction model indicates a corresponding relationship between reading and writing data information of the respective logical chunks in a next period and reading and writing data information of the respective logical chunks in the particular number of historical periods before the current time, determine physical storage areas of the respective logical chunks in the next period according to the predicted reading and writing data information of the respective logical chunks, and in the next period, in response to receiving the writing request, write the data corresponding to the writing request into the physical storage area of the logical chunk corresponding to the writing request.

According to some example embodiments of inventive concepts, there is provided a computer-readable storage medium storing computer program that, when executed by a processor, causes the processor to perform the storing method of data as described above.

In the method and/or apparatus for storing data according to inventive concepts, a workload in a future period (for example, reading and writing data information) is predicted by the data prediction model, and the physical storage area in the future period is determined according to the workload in the future period, and/or storage policy may be dynamically adjusted according to the prediction of the workload change. Thus, an improved, e.g. optimized, performance can adaptively change, for example, in the case where change in the program is the small, or the smallest The lifetime of storage apparatus (for example, SSD) can be improved. Accordingly, the overall TCO (Total cost of ownership) may be reduced.

Alternatively or additionally, the reading and writing data information predicted by the storing method and apparatus of data according to inventive concepts can reflect changes of important indicators of the workload, such as degree of cold and hot of the workload (reading and writing count).

Alternatively or additionally, in the storing method and apparatus of data according to inventive concepts, the data prediction model and the cluster centers of the reading and writing data information are each continuously updated based on the machine learning manner, and the prediction effect and the classification effect of which are continuously improved, e.g. optimized.

Additional aspects and/or advantages of inventive concepts will be set forth in part in the following description and, in part, will be apparent from the description, or may be known through implementation of inventive concepts.

BRIEF DESCRIPTION OF THE DRAWINGS

The above and other purposes, features, and advantages of inventive concepts will become more apparent from the following detailed description taken in conjunction with the accompanying drawings, wherein:

FIG. 1 is a flow chart illustrating a storing method of data according to some example embodiments of inventive concepts.

DETAILED DESCRIPTION

Example embodiments of inventive concepts will be illustrated below with reference to the accompanying drawings.

Example embodiments may be described with reference to acts and symbolic representations of operations (e.g., in the form of flow charts, flow diagrams, data flow diagrams, structure diagrams, block diagrams, etc.) that may be implemented in conjunction with units and/or devices discussed in more detail below. Although discussed in a particular manner, a function or operation specified in a specific block may be performed differently from the flow specified in a flowchart, flow diagram, etc. For example, functions or operations illustrated as being performed serially in two consecutive blocks may actually be performed concurrently, simultaneously, or in some cases be performed in reverse order.

Units and/or devices according to one or more example embodiments may be implemented using hardware, a combination of hardware and software, or storage media storing software. Hardware may be implemented using processing circuitry such as, but not limited to, one or more processors, one or more Central Processing Units (CPUs), one or more controllers, one or more arithmetic logic units (ALUs), one or more digital signal processors (DSPs), one or more microcomputers, one or more field programmable gate arrays (FPGAs), one or more System-on-Chips (SoCs), one or more programmable logic units (PLUs), one or more microprocessors, one or more Application Specific Integrated Circuits (ASICs), or any other device or devices capable of responding to and executing instructions in a defined manner.

Software may include a computer program, program code, instructions, or some combination thereof, for independently or collectively instructing or configuring a hardware device to operate as desired. The computer program and/or program code may include program or computer-readable instructions, software components, software modules, data files, data structures, etc., capable of being implemented by one or more hardware devices, such as one or more of the hardware devices mentioned above. Examples of program code include both machine code produced by a compiler and higher level program code that is executed using an interpreter.

For example, when a hardware device is a computer processing device (e.g., one or more processors, CPUs, controllers, ALUs, DSPs, microcomputers, microprocessors, etc.), the computer processing device may be configured to carry out program code by performing arithmetical, logical, and input/output operations, according to the program code. Once the program code is loaded into a computer processing device, the computer processing device may be programmed to perform the program code, thereby transforming the computer processing device into a special purpose computer processing device. In a more specific example, when the program code is loaded into a processor, the processor becomes programmed to perform the program code and operations corresponding thereto, thereby transforming the processor into a special purpose processor. In another example, the hardware device may be an integrated circuit customized into special purpose processing circuitry (e.g., an ASIC).

A hardware device, such as a computer processing device, may run an operating system (OS) and one or more software applications that run on the OS. The computer processing device also may access, store, manipulate, process, and create data in response to execution of the software. For simplicity, one or more example embodiments may be exemplified as one computer processing device; however, one skilled in the art will appreciate that a hardware device may include multiple processing elements and multiple types of processing elements. For example, a hardware device may include multiple processors or a processor and a controller. In addition, other processing configurations are possible, such as parallel processors.

Software and/or data may be embodied permanently or temporarily in any type of storage media including, but not limited to, any machine, component, physical or virtual equipment, or computer storage medium or device, capable of providing instructions or data to, or being interpreted by, a hardware device. The software also may be distributed over network coupled computer systems so that the software is stored and executed in a distributed fashion. In particular, for example, software and data may be stored by one or more computer readable recording mediums, including tangible or non-transitory computer-readable storage media as discussed herein.

Storage media may also include one or more storage devices at units and/or devices according to one or more example embodiments. The one or more storage devices may be tangible or non-transitory computer-readable storage media, such as random access memory (RAM), read only memory (ROM), a permanent mass storage device (such as a disk drive), and/or any other like data storage mechanism capable of storing and recording data. The one or more storage devices may be configured to store computer programs, program code, instructions, or some combination thereof, for one or more operating systems and/or for implementing the example embodiments described herein. The computer programs, program code, instructions, or some combination thereof, may also be loaded from a separate computer readable storage medium into the one or more storage devices and/or one or more computer processing devices using a drive mechanism. Such separate computer readable storage medium may include a Universal Serial Bus (USB) flash drive, a memory stick, a Blu-ray/DVD/CD-ROM drive, a memory card, and/or other like computer readable storage media. The computer programs, program code, instructions, or some combination thereof, may be loaded into the one or more storage devices and/or the one or more computer processing devices from a remote data storage device via a network interface, rather than via a computer readable storage medium. Additionally, the computer programs, program code, instructions, or some combination thereof, may be loaded into the one or more storage devices and/or the one or more processors from a remote computing system that is configured to transfer and/or distribute the computer programs, program code, instructions, or some combination thereof, over a network. The remote computing system may transfer and/or distribute the computer programs, program code, instructions, or some combination thereof, via a wired interface, an air interface, and/or any other like medium.

The one or more hardware devices, the storage media, the computer programs, program code, instructions, or some combination thereof, may be specially designed and constructed for the purposes of the example embodiments, or they may be known devices that are altered and/or modified for the purposes of example embodiments.

It will be understood that in the description of the FIGURE below, the various steps and/or functions may be performed by the one or more hardware devices, storage media, computer programs, program codes, or some combination thereof. Each of, or at least some of, the various steps may be performed by the same hardware device, storage media, computer program, program code, etc.

Figure 1:
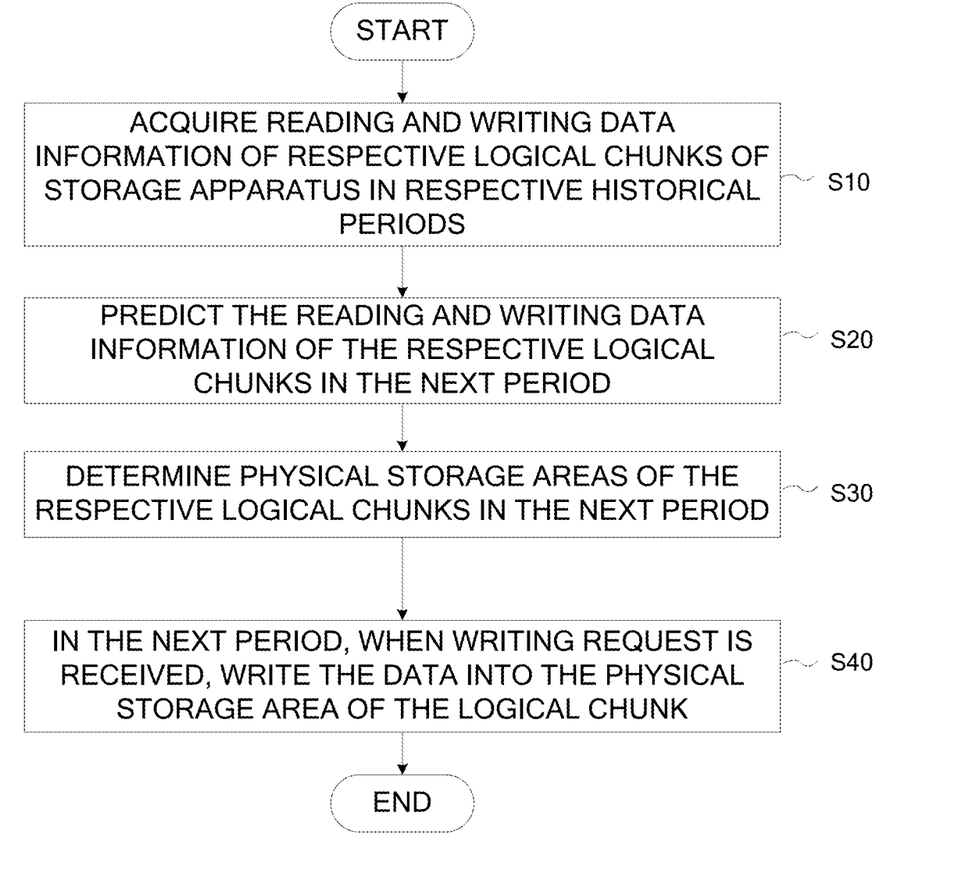

FIG. 1 is a flow chart illustrating a method of storing data according to some example embodiments of inventive concepts.

At step S10, reading and writing data information of respective logical chunks of a storage apparatus in a variable and/or predetermined number of historical periods before the current time is acquired.

The storage apparatus may be or include a solid state hard disk, and may also be or include a server including a plurality of solid state disks, and may also be or include a cluster including a plurality of servers.

The logical chunks refer to an area where a segment of contiguous logical addresses in the available storage space of the storage apparatus is located.

As a non-limiting example, the reading and writing data information of each logical chunk in respective historical periods includes reading and writing counts of each logical chunk in the respective historical periods, size distributions of each reading and writing requests of each logical chunk in the respective historical periods, and at least zero of the reading and writing ratio of each logical area in the respective historical periods, sector count of sequentially reading and writing requests of each logical area in the respective historical periods (sequentially reading/writing sector count), a bandwidth of the storage apparatus, and/or a reading and writing skewness of the storage apparatus.

As a non-limiting example, the reading and writing data information of the respective logical chunks in the respective historical periods may constitute training data sets of time series.

As a non-limiting example, the storing method of data according to some example embodiments of inventive concepts may further include (not shown in the FIGURE): acquiring reading and writing data information of the respective logical chunks of the storage apparatus in respective historical periods, and/or training a data prediction model according to the training data sets (for example, the reading and writing data information of the respective logical chunks in the respective historical periods). The data prediction model indicates a relationship between reading and writing data information of the respective logical chunks in a next period, and reading and writing data information of the respective logical chunks in a variable and/or predetermined number of historical periods before the current time.

The data prediction model is used for predicting reading and writing data information in a future next period, according to reading and writing data information in a variable and/or predetermined number of historical periods before the current time.

During the training process, the reading and writing data information of the respective logical chunks in M historical periods before the Nth historical period is used as input of the data prediction model, and the reading and writing data information of the respective logical chunks in the Nth historical period is used as target value of output of the data prediction model. M is a variable and/or predetermined number, and N is an integer having a value between 1 more than N and a total number of historical periods, that is, NE[M+1, the total number of historical periods].

For example, in the case where M is 4, the reading and write data information of the respective logical chunks in the N−1 st historical period, the reading and writing data information of the N−2nd historical period, the reading and writing data information of the N−3rd historical period, and the reading and writing data information the N−4th historical period are used as inputs of the data prediction model, and the reading and writing data information of the respective logical chunks in the Nth historical period is used as the target value of the output of the data prediction model.

As a non-limiting example, a corresponding prediction algorithm and parameters of data prediction model may be selected before training.

At step S20, the reading and writing data information of the respective logical chunks in a next period is predicted according to reading and writing data information of the respective logical chunks in the M historical periods before the current time and the data prediction model.

As a non-limiting example, the reading and writing data information of the respective logical chunks in the M historical periods before the current time, e.g. the current reading and writing time, is used as input of the data prediction model, and the data prediction model will output the reading and writing data information of the future next period.

At step S30, physical storage areas of the respective logical chunks in the next period are determined according to the predicted reading and writing data information of the respective logical chunks in the next period.

In the case where the storage apparatus is or includes a solid state disk, the physical storage area may be or include one of a plurality of storage areas in a same solid state disk. In the case where the storage apparatus is a server, the physical storage area may be one of the plurality of solid state disks in a same server. In the case where the storage apparatus is a cluster, the physical storage area may be or include one of a plurality of servers in a same cluster.

As a non-limiting example, the determined physical storage areas of the respective logical chunks in the next period may be recorded in a storage area allocation table. It can be understood that the storage area allocation table will be updated at every period.

At step S30, the physical storage areas of the respective logical chunks in the next period are determined according to the characteristics of the predicted reading and writing data information of the respective logical chunks in a next period, such as reading and writing counts, e.g. the temperature (cold and hot) of the data, the size of data of reading and writing.

Here, the physical storage areas of the respective logical chunks in the next period may be determined according to the predicted reading and writing data information of the respective logical chunks in the next period by adopting various manners. The following will describe three manners of determining physical storage areas of the respective logical chunks in the next period, according to the predicted reading and writing data information of the respective logical chunks in the next period, and it can be understood that the following three manners are only examples, and other manners by which the physical storage areas of the respective logical chunks in the next period can be determined according to the predicted reading and writing data information of the respective logical chunks in the next period can be applied to inventive concepts.

In a first non-limiting example manner, the storing method for data according to some example embodiments of inventive concepts further includes the following steps (not shown in the FIGURE): clustering the reading and writing data information of the respective logical chunks in the respective historical periods to obtain cluster centers of respective classes by using a clustering algorithm. At step S40, physical storage areas of the respective logical chunks in the next period are determined according to the predicted reading and writing data information of the respective logical chunks in the next period and the cluster centers of the respective classes.

Here, various clustering algorithms may be used to cluster the reading and writing data information of all logical chunks in all historical periods, for example, K-means clustering algorithms, mean-drift clustering algorithms, and/or density-based clustering algorithms, and/or the like.

At step S30, a class to which the reading and writing data information of the respective logical chunks in the next period belongs is determined according to the predicted reading and writing data information of the respective logical chunks in the next period and the cluster centers of the respective classes firstly, and then the physical storage areas of the respective logical chunks in the next period are determined according to the classes to which the reading and writing data information of the respective logical chunks in the next period belongs.

As a non-limiting example, for a certain logical chunk, the distance (for example, the Euclidean and/or Hamming distance) between the reading and writing data information of the logical chunk in the next period and the cluster centers of the respective classes may be determined firstly, and the class corresponding to the cluster center which is closest to the reading and writing data information of the logical chunk in the next period is determined to be the class to which the predicted reading and writing data information of the logical chunk in the next period belongs.

As a non-limiting example, a corresponding relationship between the class and the physical storage area may be pre-stored. At step S30, the physical storage areas of the respective logical chunks in the next period are determined according to both the corresponding relationships and the classes to which the reading and writing data information of the respective logical chunks in the next period belongs.

In a second non-limiting example manner, cold and hot values of the respective logical chunks in the next period are determined according to the reading and writing data information of the respective logical chunks in the next period; and the physical storage areas of the respective logical chunks in the next period are determined according to the cold and hot values of the respective logical chunks in the next period and a previously stored corresponding relationship between physical storage areas and the cold and hot value.

As a non-limiting example, a specific implementation of determining the cold and hot value according to the reading and writing data information may be set in advance. For example, respective data in the reading and writing data information may be firstly normalized, and the normalized respective data is weighted according to respective weights to obtain the cold and hot value.

In a third non-limiting example manner, the reading and writing data information of the respective logical chunks in the next period is clustered to obtain a plurality of clusters; respective clusters among the plurality of clusters are ordered to obtain sequence numbers of the respective clusters; and the physical storage areas of the respective logical chunks in the next period are determined according to the sequence numbers of the respective clusters and predefined and/or variable sequence numbers of respective physical storage areas.

As a non-limiting example, the respective clusters may be ordered according to a preset and/or variable ordering rule.

With respect to any logical chunk, the physical storage area of the any logical chunk in the next period is determined by determining a sequence number of the cluster to which the reading and writing data information of the any logical chunk in the next period belongs, thus distinguishing from the sequence number of the physical storage area, hereinafter referred to as a first sequence number.

At step S40, in the next period, when a writing request is received, the data corresponding to the writing request is written into the determined physical storage area of the logical chunk corresponding to the writing request in the next period.

The data corresponding to the writing request refers to the data requested to be written of the writing request. The logical chunk corresponding to the writing request refers to the logical chunk where the logical address of the writing request is located. As a non-limiting example, the physical storage area of the logical chunk in which the logical address of the writing request is located may be looked up from the storage area allocation table described above.

As a non-limiting example, the actual reading and writing data information of the respective logical chunks in the above next period is acquired and the data prediction model is updated according to the actual reading and writing data information of the respective logical chunk in the above next period, when the next period as described above ends.

The manner in which the data prediction model is updated may be similar to the manner in which the prediction model is trained as described above. As the data prediction model continuously updates by machine learning according to new data that is continuously emerging, thus prediction effect of which will be gradually improved, e.g. optimized. When the prediction of the reading and writing data information is performed later, the updated data prediction model is used for the prediction.

As a non-limiting example, the actual reading and writing data information of the respective logical chunks in the above next period is acquired and the cluster centers are updated according to the actual reading and writing data information of the respective logical chunk in the above next period when the next period as described above ends.

The manner in which the cluster center is updated may be similar to the manner in which the cluster center is determined as described above. As the cluster center continuously updates by machine learning according to new data that is continuously emerging, thus classification effect of which will be gradually improved, e.g. optimized. When the class to which the reading and writing data information belongs is determined later, the updated cluster center is used to determine the class to which the reading and writing data information belongs.

According to some example embodiments of inventive concepts, there is also provided a storage apparatus for the data, and the storage apparatus includes a processor.

The processor is configured to acquire reading and writing data information of respective logical chunks of a storage apparatus in a variable and/or predetermined number of historical periods before a current time.

The storage apparatus may be or include a solid state hard disk, and may also be or include a server including a plurality of solid state disks, and may also be or include a cluster including a plurality of servers.

The logical chunk refers to an area where a segment of contiguous logical addresses in the available storage space of the storage apparatus is located.

As a non-limiting example, the reading and writing data information of each logical chunk in respective historical periods includes reading and writing count of each logical chunk in the respective historical periods, size distribution of each reading and writing requests of each logical chunk in the respective historical periods, and at least zero of the reading and writing ratio of each logical area in the respective historical periods, sector count of sequentially reading and writing requests of each logical area in the respective historical periods, a bandwidth of the storage apparatus, and a reading and writing skewness of the storage apparatus.

As a non-limiting example, the reading and writing data information of the respective logical chunks in the respective historical periods may constitute training data sets of time series.

The processor is further configured to acquire reading and writing data information of the respective logical chunks of the storage apparatus in respective historical periods and to train the data prediction model according to the training data sets (for example, the reading and writing data information of the respective logical chunks in the respective historical periods). The data prediction model indicates a corresponding relationship between reading and writing data information of the respective logical chunks in a next period and reading and writing data information of the respective logical chunks in a variable and/or predetermined number of historical periods before the current time.

The data prediction model is used for predicting reading and writing data information in a future next period, according to reading and writing data information in a variable and/or predetermined number of historical periods before the current time.

During the training process, the reading and writing data information of the respective logical chunks in the M historical periods before the Nth historical period is used as input of the data prediction model, and the reading and writing data information of the respective logical chunks in the Nth historical period is used as target value of output of the data prediction model. M is a variable and/or predetermined number, and N is an integer having a value ranging from one more than the particular number to the total number of historical periods, that is, $N \in [M+1$, the total number of historical periods].

For example, in the case where M is 4, the reading and write data information of the respective logical chunks in the N−1 st historical period, the reading and writing data information of the N−2nd historical period, the reading and writing data information of the N−3th historical period, and the reading and writing data information the N−4th historical period are used as inputs of the data prediction model, and the reading and writing data information of the respective logical chunks in the Nth historical period is used as the target value of the output of the data prediction model.

As a non-limiting example, a corresponding prediction algorithm and parameters of data prediction model may be selected before training.

The processor is further configured to predict the reading and writing data information of the respective logical chunks in the next period, according to reading and writing data information of the respective logical chunks in M historical periods before the current time and a data prediction model As a non-limiting example, the reading and writing data information of the respective logical chunks in the M historical periods before the current time is used as input of the data prediction model, and the data prediction model will output the reading and writing data information of the future next period.

The processor is further configured to determine physical storage areas of the respective logical chunks in the next period according to the predicted reading and writing data information of the respective logical chunks in the next period.

In the case where the storage apparatus is or includes a solid state disk, the physical storage area may be or include one of a plurality of storage areas in a same solid state disk. In the case where the storage apparatus is or includes a server, the physical storage area may be or include one of the plurality of solid state disks in a same server. In the case where the storage apparatus is or includes a cluster, the physical storage area may be or include one of a plurality of servers in a same cluster.

As a non-limiting example, the determined physical storage areas of the respective logical chunks in the next period may be recorded in a storage area allocation table. It can be understood that the storage area allocation table will be updated at every period.

The processor is further configured to determine the physical storage areas of the respective logical chunks in the next period according to the characteristics of the predicted reading and writing data information of the respective logical chunks in a next period, such as reading and writing counts (cold and hot of data) and/or the size of data of reading and writing.

Here, the processor may adopt various manners to determine the physical storage areas of the respective logical chunks in the next period according to the predicted reading and writing data information of the respective logical chunks in the next period. The following will describe three manners of determining physical storage areas of the respective logical chunks in the next period, according to the predicted reading and writing data information of the respective logical chunks in the next period, and it can be understood that the following three manners are only examples, and other manners by which the physical storage areas of the respective logical chunks in the next period can be determined according to the predicted reading and writing data information of the respective logical chunks in the next period can be applied to inventive concepts.

In a first non-limiting example manner, the processor is further configured to cluster the reading and writing data information of the respective logical chunks in the respective historical periods to obtain cluster centers of respective classes by using clustering algorithm. Thus, the processor may determine the physical storage areas of the respective logical chunks in the next period according to the predicted reading and writing data information of the respective logical chunks in the next period and the cluster centers of the respective classes.

Here, various clustering algorithms may be used to cluster the reading and writing data information of all logical chunks in all historical periods, for example, K-means clustering algorithm, mean-drift clustering algorithm, and density-based clustering algorithm and the like.

The processor is further configured to determine a class to which the reading and writing data information of the respective logical chunks in the next period belongs, according to the predicted reading and writing data information of the respective logical chunks in the next period and the cluster centers of the respective classes firstly; and then determining the physical storage areas of the respective logical chunks in the next period, according to the classes to which the predicted reading and writing data information of the respective logical chunks in the next period belongs.

As a non-limiting example, for a certain logical chunk, the distance (for example, the Euclidean and/or Hamming distance) between the reading and writing data information of the logical chunk in the next period and the cluster centers of the respective classes may be determined firstly, and the class corresponding to the cluster center which is closest to the reading and writing data information of the logical chunk in the next period is determined to the class to which the predicted reading and writing data information of the logical chunk in the next period belongs.

As a non-limiting example, a corresponding relationship between the class and the physical storage area may be pre-stored. The processor determines the physical storage areas of the respective logical chunks in the next period according to the corresponding relationship and the classes to which the reading and writing data information of the respective logical chunks in the next period belongs.

In a second non-limiting example manner, the processor determines cold and hot values of the respective logical chunks in the next period according to the reading and writing data information of the respective logical chunks in the next period. The processor determines the physical storage areas of the respective logical chunks in the next period according to both the cold and hot values of the respective logical chunks in the next period and a previously stored corresponding relationship between physical storage areas and the cold and hot value.

As a non-limiting example, a specific implementation of determining the cold and hot value according to the reading and writing data information may be set in advance. For example, respective data in the reading and writing data information may be normalized firstly, and the normalized respective data is weighted according to respective weights to obtain the cold and hot value.

In a third non-limiting example manner, the processor clusters the reading and writing data information of the respective logical chunks in the next period to obtain a plurality of clusters; orders respective clusters among the plurality of clusters to obtain sequence numbers of the respective clusters; and determines the physical storage areas of the respective logical chunks in the next period according to the sequence numbers of the respective clusters and predefined sequence numbers of respective physical storage areas.

As a non-limiting example, the respective clusters may be ordered according to a preset and/or variable ordering rule.

With respect to any logical chunk, the physical storage area of the any logical chunk in the next period is determined by determining a sequence number of the cluster to which the reading and writing data information of the any logical chunk in the next period belongs (in order to distinguish from the sequence number of the physical storage area, hereinafter referred to as a first sequence number), determining the physical storage area having the same sequence number as the first sequence number as the physical storage area of the any logical chunk in the next period.

The processor is further configured to, in the next period when a writing request is received, write the data corresponding to the writing request into the physical storage area of the logical chunk corresponding to the writing request.

The data corresponding to the writing request refers to the data requested to be written of the writing request. The logical chunk corresponding to the writing request refers to the logical chunk where the logical address of the writing request is located. As a non-limiting example, the physical storage area of the logical chunk in which the logical address of the writing request is located may be looked up from the storage area allocation table as described above.

As a non-limiting example, the processor acquires the actual reading and writing data information of the respective logical chunks in the above next period is acquired and updates the data prediction model according to the actual reading and writing data information of the respective logical chunk in the above next period, when the next period as described above ends.

The manner in which the data prediction model is updated may be similar to the manner in which the prediction model is trained as described above. As the data prediction model continuously updates by machine learning according to new data that is continuously emerging, thus prediction effect of which will be gradually optimized. The processor uses the updated data prediction model to perform predict, when the prediction of the reading and writing data information is performed later.

As a non-limiting example, the processor acquires the actual reading and writing data information of the respective logical chunks in the above next period and updates the cluster centers according to the actual reading and writing data information of the respective logical chunk in the above next period when the next period as described above ends.

The manner in which the cluster center is updated may be similar to the manner in which the cluster center is determined as described above. As the cluster center continuously updates by machine learning according to new data that is continuously emerging, thus classification effect of which will be gradually optimized. The processor uses the updated cluster center to determine the class to which the reading and writing data information belongs, when the class to which the reading and writing data information belongs is determined later.

In the storing method and apparatus of data according to inventive concepts, a workload in a future period (that is, reading and writing data information) is predicted by the data prediction model, and the physical storage area in the future period is determined according to the workload in the future period, and storage policy may be dynamically adjusted according to the prediction of the workload change, so that while achieving better optimization effect, it can adaptively adapt change in the upper operation in the case where change in the program is the smallest, and can extend the usage lifetime of storage apparatus (for example, SSD), and improve the performance of reading and writing, and thereby the overall TCO is reduced.

In addition, the reading and writing data information predicted by the storing method and apparatus of data according to inventive concepts can reflect changes of important indicators of the workload, such as degree of cold and hot of the workload (reading and writing count).

In addition, in the storing method and apparatus of data according to inventive concepts, the data prediction model and the cluster centers of the reading and writing data information are each continuously updated based on the machine learning manner, and the prediction effect and the classification effect of which are continuously optimized.

According to some example embodiments of inventive concepts, there is provided a computer-readable storage medium storing computer program that, when the computer program is executed, causes the processor to achieve the method as described above.

In addition, the method according to an exemplary embodiment of inventive concepts may be embodied as a computer program in a computer readable recording medium. Those skilled in the art can implement the computer program in accordance with the description of the above method. The above method of inventive concepts is implemented when the computer program is executed in a computer.

While inventive concepts have been presented and described with reference to the exemplary embodiments in detail, it should be understood by those of ordinary skill in the art that various changes in form and details may be made therein without departing from the spirit and scope of inventive concepts which is defined by the appended claims.

What is claimed:

1. A method of storing data, comprising:
   acquiring reading and writing data information of respective logical chunks of a storage apparatus in a particular number of historical periods before a current time, the reading and writing data information before a current time including at least one property of data read from and/or written to the storage apparatus before the current time;
   predicting reading and writing data information of the respective logical chunks in a next period, the reading and writing data information in a next period including at least one property of data read to be read from and/or written to the storage apparatus in the next period, the predicting the reading and writing being according to a) the reading and writing data information of the respective logical chunks in the particular number of historical periods before the current time and b) a data prediction model, wherein the data prediction model indicates,
      a corresponding relationship between reading and writing data information of the respective logical chunks in a next period, and
      reading and writing data information of the respective logical chunks in the particular number of historical periods before the current time;
   determining physical storage areas of the respective logical chunks in the next period, according to the predicted reading and writing data information of the respective logical chunks in the next period; and
   in the next period, in response to receiving a writing request, writing the data corresponding to the writing request into the physical storage area of the logical chunk corresponding to the writing request.

2. The storing method of data of claim 1, further comprising:
   clustering the reading and writing data information of the respective logical chunks in the respective historical periods to obtain cluster centers of respective classes, wherein the determining the physical storage areas of the respective logical chunks in the next period according to the predicted reading and writing data information of the respective logical chunks in the next period comprises,
   determining the physical storage areas of the respective logical chunks in the next period according to a) the predicted reading and writing data information of the respective logical chunks in the next period, and b) the cluster centers of the respective classes.

3. The storing method of data of claim 2, wherein the determining physical storage areas of the respective logical chunks in the next period according to the predicted reading and writing data information of the respective logical chunks in the next period comprises:
   determining a class to which the predicted reading and writing data information of the respective logical chunks in the next period belongs, the determining the class being according to a) the predicted reading and writing data information of the respective logical chunks in the next period and b) the cluster centers of the respective classes; and
   determining the physical storage areas of the respective logical chunks in the next period, the determining the physical storage areas being according to the classes to which the predicted reading and writing data information of the respective logical chunks in the next period belongs.

4. The storing method of data of claim 3, wherein the determining the physical storage areas of the respective logical chunks in the next period according to the classes to which the predicted reading and writing data information of the respective logical chunks in the next period belongs comprises:
   determining the physical storage areas of the respective logical chunks in the next period according to a) a corresponding relationship between the respective classes and the physical storage areas and b) the classes to which the predicted reading and writing data information of the respective logical chunks in the next period belongs.

5. The storing method of data of claim 2, further comprising:
   updating the cluster centers according to the actual reading and writing data information of the respective logical chunk in the next period in response to the next period ending.

6. The storing method of data of claim 1, wherein determining physical storage areas of the respective logical chunks in the next period according to the predicted reading and writing data information of the respective logical chunks in the next period comprises:
   determining reading and writing counts of the respective logical chunks in the next period according to the reading and writing data information of the respective logical chunks in the next period; and
   determining the physical storage areas of the respective logical chunks in the next period according to a) the reading and writing counts of the respective logical chunks in the next period and b) a previously stored relationship between the physical storage areas and the reading and writing counts.

7. The storing method of data of claim 1, wherein the determining physical storage areas of the respective logical chunks in the next period according to the predicted reading and writing data information of the respective logical chunks in the next period comprises:
   clustering the reading and writing data information of the respective logical chunks in the next period to obtain a plurality of clusters;
   ordering respective clusters among the plurality of clusters to obtain sequence numbers of the respective clusters; and
   determining the physical storage areas of the respective logical chunks in the next period according to the sequence numbers of the respective clusters and other sequence numbers of respective physical storage areas, wherein, with respect to any of the respective logical chunks, the physical storage area of the any of the respective logical chunks in the next period is determined by,
    determining a first serial number of the cluster to which the reading and writing data information of the any of the respective logical chunks in the next period belongs, and
    determining the physical storage area having a same serial number as the first serial number as the physical storage area of the any of the respective logical chunks in the next period.

8. The storing method of data of claim 1, wherein the physical storage area indicates at least one of,
    a plurality of storage areas in a same solid state disk,
    a plurality of solid state disks in a same server, or
    a plurality of servers in a same cluster.

9. The storing method of data of claim 1, further comprising:
    updating the data prediction model according to actual reading and writing data information of the respective logical chunks in the next period in response to the next period ending.

10. A method of storing data, comprising:
    acquiring reading and writing data information of respective logical chunks of a storage apparatus in a particular number of historical periods before a current time;
    predicting reading and writing data information of the respective logical chunks in a next period, the predicting the reading and writing being according to a) the reading and writing data information of the respective logical chunks in the particular number of historical periods before the current time and b) a data prediction model, wherein the data prediction model indicates,
        a corresponding relationship between reading and writing data information of the respective logical chunks in a next period, and
        reading and writing data information of the respective logical chunks in the particular number of historical periods before the current time;
    determining physical storage areas of the respective logical chunks in the next period, according to the predicted reading and writing data information of the respective logical chunks in the next period;
    in the next period, in response to receiving a writing request, writing the data corresponding to the writing request into the physical storage area of the logical chunk corresponding to the writing request;
    acquiring reading and writing data information of the respective logical chunks of the storage apparatus in respective historical periods; and
    training the data prediction model according to the reading and writing data information of the respective logical chunks in the respective historical periods, wherein
    in the training, the reading and writing data information of the respective logical chunks in the particular number of historical periods before an Nth historical period corresponds to an input of the data prediction model, the reading and writing data information of the respective logical chunks in the Nth historical period corresponds to a target value of output of the data prediction model, where N is a natural number between a) one more than the particular number and b) a total number of historical periods.

11. The storing method of data of claim 10, wherein the reading and writing data information of each logical chunk in the respective historical periods comprises:
    reading and writing,
    a count of each logical chunk in the respective historical periods, and
    a size distribution of each reading and writing request of each logical chunk in the respective historical periods.

12. The storing method of data of claim 11, wherein the reading and writing data information of each logical chunk in the respective historical periods comprises at least one of,
    the reading and writing ratio of each logical area in the respective historical periods,
    sector counts of sequentially reading and writing requests of each logical region in the respective historical periods,
    a bandwidth of the storage apparatus in the respective historical periods, or
    a reading and writing skewness of the storage apparatus in the respective historical periods.

13. A storing apparatus of data, comprising:
    a processor, wherein the processor is configured to execute non-transitory machine readable instructions that, when executed by the processor, cause the process to,
    acquire reading and writing data information of respective logical chunks of a storage apparatus in a particular number of historical periods before a current time, the reading and writing data information before a current time including at least one property of data read from and/or written to the storage apparatus before the current time,
    predict reading and writing data information of the respective logical chunks in a next period, the reading and writing data information in a next period including at least one property of data read to be read from and/or written to the storage apparatus in the next period, the prediction being according to,
        the reading and writing data information of the respective logical chunks in the particular number of historical periods before the current time,
        and a data prediction model, wherein the data prediction model indicates a corresponding relationship between reading and writing data information of the respective logical chunks in a next period and reading and writing data information of the respective logical chunks in the particular number of historical periods before the current time,
    determine physical storage areas of the respective logical chunks in the next period according to the predicted reading and writing data information of the respective logical chunks, and
    in the next period, in response to receiving the writing request, write the data corresponding to the writing request into the physical storage area of the logical chunk corresponding to the writing request.

14. The storing apparatus of claim 13, wherein the processor is further configured to execute machine readable instructions that when executed by the processor cause the processor to:
    acquire reading and writing data information of the respective logical chunks of the storage apparatus in respective historical periods;
    train the data prediction model according to the reading and writing data information of the respective logical chunks in the respective historical periods, wherein in the training, the reading and writing data information of the respective logical chunks in the number of historical periods before the Nth historical period is used as input of the data prediction model, the reading and writing data information of the respective logical chunks in the Nth historical period is used as target value of output of the data prediction model, where N is a natural number with a value between a) one more than the particular number and b) a total number of historical periods.

15. The storing apparatus of claim 14, wherein the reading and writing data information of each logical chunk in the respective historical periods comprises:
   reading and writing a) a count of each logical chunk in the respective historical periods, and
   b) size distribution of each reading and writing requests of each logical chunk in the respective historical periods.

16. The storing apparatus of claim 15, wherein the reading and writing data information of each logical chunk in the respective historical periods comprises at least one of,
   the reading and writing ratio of each logical area in the respective historical periods,
   sector counts of sequentially reading and writing requests of each logical region in the respective historical periods, and
   a bandwidth of the storage apparatus in the respective historical periods, and a reading and writing skewness of the storage apparatus in the respective historical periods.

17. The storing apparatus of data of claim 15, wherein the determining physical storage areas of the respective logical chunks in the next period according to the predicted reading and writing data information of the respective logical chunks in the next period comprises:
   determining a class to which the predicted reading and writing data information of the respective logical chunks in the next period belongs according to a) the predicted reading and writing data information of the respective logical chunks in the next period and b) the cluster centers of the respective classes; and
   determining the physical storage areas of the respective logical chunks in the next period according to the classes to which the predicted reading and writing data information of the respective logical chunks in the next period belongs.

18. The storing apparatus of claim 13, wherein the processor is further configured to:
   cluster the reading and writing data information of the respective logical chunks in the respective historical periods to obtain cluster centers of respective classes,
   wherein, determine the physical storage areas of the respective logical chunks in the next period according to the predicted reading and writing data information of the respective logical chunks in the next period comprises: determining the physical storage areas of the respective logical chunks in the next period, according to the predicted reading and writing data information of the respective logical chunks in the next period and the cluster centers of the respective classes.

19. The storing apparatus of data of claim 18, wherein determining the physical storage areas of the respective logical chunks in the next period according to the classes to which the predicted reading and writing data information of the respective logical chunks in the next period belongs comprises:
   determining the physical storage areas of the respective logical chunks in the next period according to a relationship between a) the respective classes and the physical storage areas and b) the classes to which the predicted reading and writing data information of the respective logical chunks in the next period belongs.

20. The storing apparatus of data of claim 13, wherein determining physical storage areas of the respective logical chunks in the next period according to the predicted reading and writing data information of the respective logical chunks in the next period comprises:
   determining reading and writing counts of the respective logical chunks in the next period according to the reading and writing data information of the respective logical chunks in the next period;
   determining the physical storage areas of the respective logical chunks in the next period, according to the reading and writing counts of the respective logical chunks in the next period and a previously stored relationship between a) physical storage areas and b) the reading and writing counts.

* * * * *